US011312321B2

(12) United States Patent
Sato

(10) Patent No.: US 11,312,321 B2
(45) Date of Patent: Apr. 26, 2022

(54) ON-BOARD POWER CONTROL APPARATUS AND ON-BOARD POWER CONTROL SYSTEM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shinichiro Sato, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 43 days.

(21) Appl. No.: 17/042,242

(22) PCT Filed: Mar. 7, 2019

(86) PCT No.: PCT/JP2019/008984
§ 371 (c)(1),
(2) Date: Sep. 28, 2020

(87) PCT Pub. No.: WO2019/188077
PCT Pub. Date: Oct. 3, 2019

(65) Prior Publication Data
US 2021/0138983 A1    May 13, 2021

(30) Foreign Application Priority Data
Mar. 28, 2018   (JP) .............................. JP2018-062680

(51) Int. Cl.
*B60R 16/033*   (2006.01)
*H02J 7/00*   (2006.01)
*H03K 3/017*   (2006.01)

(52) U.S. Cl.
CPC .......... *B60R 16/033* (2013.01); *H02J 7/0048* (2020.01); *H02J 7/0063* (2013.01); *H03K 3/017* (2013.01)

(58) Field of Classification Search
CPC ...... B60R 16/033; B60R 16/03; H02J 7/0048; H02J 7/0063; H02J 7/007192;
(Continued)

(56) References Cited

U.S. PATENT DOCUMENTS

2004/0084232 A1*  5/2004  Obayashi .............. H02J 7/1423
                                                        180/65.28
2004/0155624 A1*  8/2004  Amano .................. H02J 7/1438
                                                        320/104
(Continued)

FOREIGN PATENT DOCUMENTS

JP        H6-107089 A       4/1994
JP        2005-318730 A     11/2005
(Continued)

OTHER PUBLICATIONS

International Search Report, Application No. PCT/JP2019/008984, dated May 7, 2019. ISA/Japan Patent Office.

*Primary Examiner* — Lincoln D Donovan
*Assistant Examiner* — Alex W Lam
(74) *Attorney, Agent, or Firm* — Honigman LLP

(57) ABSTRACT

The present disclosure provides a configuration that can determine whether to suppress the power consumption of a load based on the state of a battery, and reduce the duty ratio to be supplied to a switch unit that is provided on a power supply path to the load, when the power consumption is to be suppressed. In an on-board power control apparatus, when a determination unit determines that a prediction value of an output voltage of a battery is less than a threshold voltage value, a duty ratio setting unit selects at least one of the plurality of loads as a target load for which power supply
(Continued)

is to be stopped or suppressed, and the duty ratio setting unit resets duty ratios to reduce a duty ratio of a control signal to be output to a switch unit provided on a power supply path to the selected target load.

6 Claims, 10 Drawing Sheets

(58) Field of Classification Search
CPC ... H02J 7/007182; H03K 3/017; Y02E 60/10; H01M 10/48; H01M 10/44
See application file for complete search history.

(56) References Cited

U.S. PATENT DOCUMENTS

2010/0079002 A1* 4/2010 Kishimoto ............ H02J 7/0014
307/43
2016/0363060 A1* 12/2016 Shinohara ............. B60W 10/06

FOREIGN PATENT DOCUMENTS

| | | |
|---|---|---|
| JP | 2006-205867 A | 8/2006 |
| JP | 2006-304515 A | 11/2006 |

* cited by examiner

FIG. 9

(A) Winter cut table

| Priority level number | Load | Current | 0 | 1 | 2 |
|---|---|---|---|---|---|
| 0 | Seat heater | Ia1 | 100 | 50 | 0 |
| 1 | Steering heater | Ia2 | 100 | 0 | 0 |
| 2 | Rear defogger | Ia3 | 100 | 0 | 0 |
| 3 | Wiper deicer | Ia4 | 100 | 0 | 0 |
| 4 | Mirror heater | Ia5 | 100 | 0 | 0 |

(B) Summer cut table

| Priority level number | Load | Current | 0 | 1 | 2 |
|---|---|---|---|---|---|
| 0 | Rear defogger | Ib1 | 100 | 0 | 0 |
| 1 | Seat heater | Ib2 | 100 | 50 | 0 |
| 2 | Steering heater | Ib3 | 100 | 0 | 0 |
| 3 | Wiper deicer | Ib4 | 100 | 0 | 0 |
| 4 | Mirror heater | Ib5 | 100 | 0 | 0 |

| Load | Current |
|---|---|
| Seat heater | Ia1 |
| Steering heater | Ia2 |
| Rear defogger | Ia3 |
| Wiper deicer | Ia4 |
| Mirror heater | Ia5 |

(B)

| Load | Voltage drop table |
|---|---|
| Seat heater | Ia1 × Rb |
| Steering heater | Ia2 × Rb |
| Rear defogger | Ia3 × Rb |
| Wiper deicer | Ia4 × Rb |
| Mirror heater | Ia5 × Rb |

FIG. 11

| Load | Previous duty ratio | Current duty ratio | Difference duty ratio |
|---|---|---|---|
| Seat heater | D11 | D21 | D21−D11 |
| Steering heater | D12 | D22 | D22−D12 |
| Rear defogger | D13 | D23 | D23−D13 |
| Wiper deicer | D14 | D24 | D24−D14 |
| Mirror heater | D15 | D25 | D25−D15 |

FIG. 12

| Load | Difference duty ratio | Current when duty ratio is 100% | Current change amount |
|---|---|---|---|
| Seat heater | D21−D11 | Ia1 | $\Delta$I1=Ia1 × (D21−D11) |
| Steering heater | D22−D12 | Ia2 | $\Delta$I2=Ia2 × (D22−D12) |
| Rear defogger | D23−D13 | Ia3 | $\Delta$I3=Ia3 × (D23−D13) |
| Wiper deicer | D24−D14 | Ia4 | $\Delta$I4=Ia4 × (D24−D14) |
| Mirror heater | D25−D15 | Ia5 | $\Delta$I5=Ia5 × (D25−D15) |

ON-BOARD POWER CONTROL APPARATUS AND ON-BOARD POWER CONTROL SYSTEM

CROSS-REFERENCE TO RELATED APPLICATIONS

This application is the U.S. national stage of PCT/JP2019/008984 filed on Mar. 7, 2019, which claims priority of Japanese Patent Application No. JP 2018-062680 filed on Mar. 28, 2018, the contents of which are incorporated herein.

TECHNICAL FIELD

The present disclosure relates to an on-board power control apparatus and an on-board power control system.

BACKGROUND

JP 2006-304515A discloses a power supply system that aims to suppress the energy consumption of electrical loads. The power supply system disclosed by JP 2006-304515A includes: a power supply voltage detection means for detecting a voltage value of a power supply line to which a power supply is connected; a semiconductor switch that is connected to an electrical load to which power is to be supplied, and that can be PWM-controlled; and a control means for performing PWM control on a switch element that is connected to the load, to control effective power that is to be supplied to the load. This power supply system operates so as to reduce power supplied to the load such that, when the power supply voltage value is higher than a minimum voltage value, the semiconductor switch connected to the electrical load is subjected to PWM control with the duty ratio being set to be lower than 1.

According to the technique disclosed in JP 2006-304515A, when the power consumption of a load is to be suppressed, the semiconductor switches on all of the paths that are to be subjected to suppression are PWM-controlled with a duty ratio (a reduced duty ratio) calculated using a predetermined arithmetic expression. Therefore, there is a problem in that power is uniformly suppressed without considering the circumstances of the individual loads. For example, power supplied to a load of a high degree of importance that is not desired to be supplied with reduced power is suppressed to the same extent as power supplied to a load of a low degree of importance that does not cause a significant problem even if power supplied thereto is temporarily reduced.

On the other hand, according to the technique disclosed in JP 6-107089A, when a plurality of loads are simultaneously requested to operate, control is performed so that a priority level is set to each of the loads according to the frequency at which the occupant requests that the load operate, and then the duty ratio of each load is changed. However, according to the technique disclosed in JP 6-107089A, the above-described control is performed upon a plurality of loads being simultaneously requested to operate, and is not performed upon the state of a battery being accurately measured or predicted. Therefore, there is the risk of control being not performed so as to fit the current or future state of the battery.

The present disclosure has been made to solve at least one of the above-described problems, and aims to provide a configuration that can determine whether or not to suppress the power consumption of a load based on the current or future state of a battery, and reduce the duty ratio to be supplied to a switch unit that is provided on a power supply path to the load, when the power consumption is to be suppressed.

SUMMARY

An on-board power control apparatus that is a first aspect of the present disclosure is an on-board power control apparatus that is included in an on-board power control system. The on-board power control system includes a plurality of power supply paths for supplying power from a battery to a plurality of loads; and a plurality of switch units provided on the plurality of power supply paths, and that controls power supply from the battery to the plurality of loads. The on-board power control apparatus includes: a power control unit that is configured to output control signals such that an ON signal and an OFF signal are alternatingly output to each of the plurality of switch units, and controls a duty ratio of each of the control signals respectively supplied to the plurality of switch units; and an air temperature detection unit that detects an air temperature. The power control unit includes: a determination unit that determines whether or not a prediction value of an output voltage of the battery calculated using a predetermined voltage prediction value calculation method is less than a threshold voltage value, based on settings of a load state setting unit that sets operation states of the loads; a duty ratio setting unit that sets duty ratios of control signals that are respectively output to the plurality of switch units; and a drive unit that outputs the control signals with the duty ratios set by the duty ratio setting unit, to the plurality of switch units. A priority level setting unit that sets priority levels of power supply to the plurality of loads, the priority level setting unit includes a storage unit that stores correspondence information that defines a plurality of priority level setting methods and a plurality of temperature conditions associated with each other. The priority level setting unit sets priority levels of power supply to the plurality of loads based on the air temperature detected by the air temperature detection unit and the correspondence information stored in the storage unit, using a priority level setting method corresponding to the air temperature detected by the air temperature detection unit. When the determination unit determines that the prediction value of the output voltage of the battery is no less than the threshold voltage value or when the determination unit determines that the prediction value is no less than the threshold voltage value and a predetermined condition is satisfied, the duty ratio setting unit sets the duty ratios of the control signals to be output to the plurality of switch units based on the content of settings of the load state setting unit. When the determination unit determines that the prediction value of the output voltage of the battery is less than the threshold voltage value, the duty ratio setting unit selects, from among the plurality of loads, a certain number of target loads for which power supply is to be stopped or suppressed, in ascending order of priority levels, based on the content of settings of the priority level setting unit, such that the prediction value of the output voltage calculated using the voltage prediction value calculation method satisfies a predetermined increase condition, and the duty ratio setting unit resets the duty ratios so as to reduce the duty ratios of the control signals to be output to the switch units provided on the power supply paths to the target loads thus selected.

An on-board power control apparatus that is a second aspect of the present disclosure is an on-board power control apparatus that is included in an on-board power control system. The on-board power control system includes: a plurality of power supply paths for supplying power from a battery to a plurality of loads; and a plurality of switch units provided on the plurality of power supply paths, and that controls power supply from the battery to the plurality of loads. The on-board power control apparatus includes: a power control unit that is configured to output control signals such that an ON signal and an OFF signal are alternatingly output to each of the plurality of switch units, and controls a duty ratio of each of the control signals respectively supplied to the plurality of switch units; and an air temperature detection unit that detects an air temperature, wherein the power control unit includes: an SOC detection unit that acquires a value that can specify an SOC (State Of Charge) of the battery; a priority level setting unit that sets priority levels of power supply to the plurality of loads; a duty ratio setting unit that sets duty ratios of control signals that are respectively output to the plurality of switch units; and a drive unit that outputs the control signals with the duty ratios set by the duty ratio setting unit, to the plurality of switch units. When the SOC of the battery is no less than a predetermined threshold SOC value or when the SOC of the battery is no less than the predetermined threshold SOC value and a predetermined condition is satisfied, the duty ratio setting unit sets the duty ratios of the control signals to be output to the plurality of switch units based on the content of settings of a load state setting unit that sets operation states of the loads. When the SOC of the battery is less than the threshold SOC value, the duty ratio setting unit selects a certain number of target loads for which power supply is to be stopped or suppressed, in ascending order of priority levels, based on the content of settings of the priority level setting unit, such that a prediction value of an output current from the battery calculated using a predetermined current prediction value calculation method satisfies a predetermined reduction condition, and the duty ratio setting unit resets the duty ratios so as to reduce the duty ratios of the control signals to be output to the switch units provided on the power supply paths to the target loads thus selected, the priority level setting unit includes a storage unit that stores correspondence information that defines a plurality of priority level setting methods and a plurality of temperature conditions associated with each other. The priority level setting unit sets priority levels of power supply to the plurality of loads based on the air temperature detected by the air temperature detection unit and the correspondence information stored in the storage unit, using a priority level setting method corresponding to the air temperature detected by the air temperature detection unit.

An on-board power control system according to a third aspect of the present disclosure includes the on-board power control apparatus according to the first aspect or the second aspect and the plurality of switch units.

Advantageous Effects of Disclosure

In the on-board power control apparatus according to the first aspect, when the determination unit determines that the prediction value of the output voltage of the battery is less than the threshold voltage value, the duty ratio setting unit selects at least one of the plurality of loads as a target load for which power supply is to be stopped or suppressed, and resets the duty ratios so as to reduce the duty ratio of the control signal to be output to the switch unit provided on the power supply path to the target load thus selected.

With such a configuration, if it is predicted that the output voltage of the battery will be less than the threshold voltage value in the future, power supply to at least one of the loads can be stopped or suppressed, and thus the output voltage predicted to decrease in the future can be improved. Therefore, it is possible to stop or prevent the output voltage of the battery from becoming too low, and make it less likely that a problem will be caused by a decrease in the output voltage of the battery.

In the on-board power control apparatus according to the second aspect, when the SOC of the battery is less than the threshold SOC value, the duty ratio setting unit selects a certain number of target loads for which power supply is to be stopped or suppressed, in ascending order of priority levels, based on the content of settings of the priority level setting unit, such that a prediction value of an output current from the battery satisfies a predetermined reduction condition, and the duty ratio setting unit resets the duty ratios so as to reduce the duty ratios of the control signals to be output to the switch units provided on the power supply paths to the target loads thus selected.

With such a configuration, if the SOC of the battery is less than the predetermined level, it is possible to stop or suppress power supply to loads, and stop or prevent an excessive current from being further output in a state where the SOC is low. In addition, a certain number of target loads for which power supply is to be stopped or suppressed are selected in ascending order of priority levels such that the prediction value of the output current from the battery satisfies the predetermined reduction condition. Therefore, it is easier to prevent the SOC from being too low while maintaining power supply to loads with high priority levels as much as possible.

With the on-board power control system according to the third embodiment, it is possible to realize a power control system that can achieve the same effects as the on-board power control apparatus according to the first aspect or the second aspect.

BRIEF DESCRIPTION OF DRAWINGS

FIG. 9(A) is a table conceptually illustrating the content of a second table used in the power control shown in FIG. 3, and FIG. 9(B) is a table conceptually illustrating the content of a first table used in the power control shown in FIG. 3.

FIG. 10(A) is a table illustrating a correspondence relationship between loads and currents defined in the second table, and FIG. 10(B) illustrates a voltage drop table.

FIG. 11 is a table illustrating a correspondence relationship between a previous duty ratio, a current duty ratio, and a difference duty ratio, of each load.

FIG. 12 is a table illustrating a correspondence relationship between a difference duty ratio, an amount of current when the duty ratio is 100%, and an amount of change in a current, of each load.

DETAILED DESCRIPTION OF PREFERRED EMBODIMENTS

Figure 1:
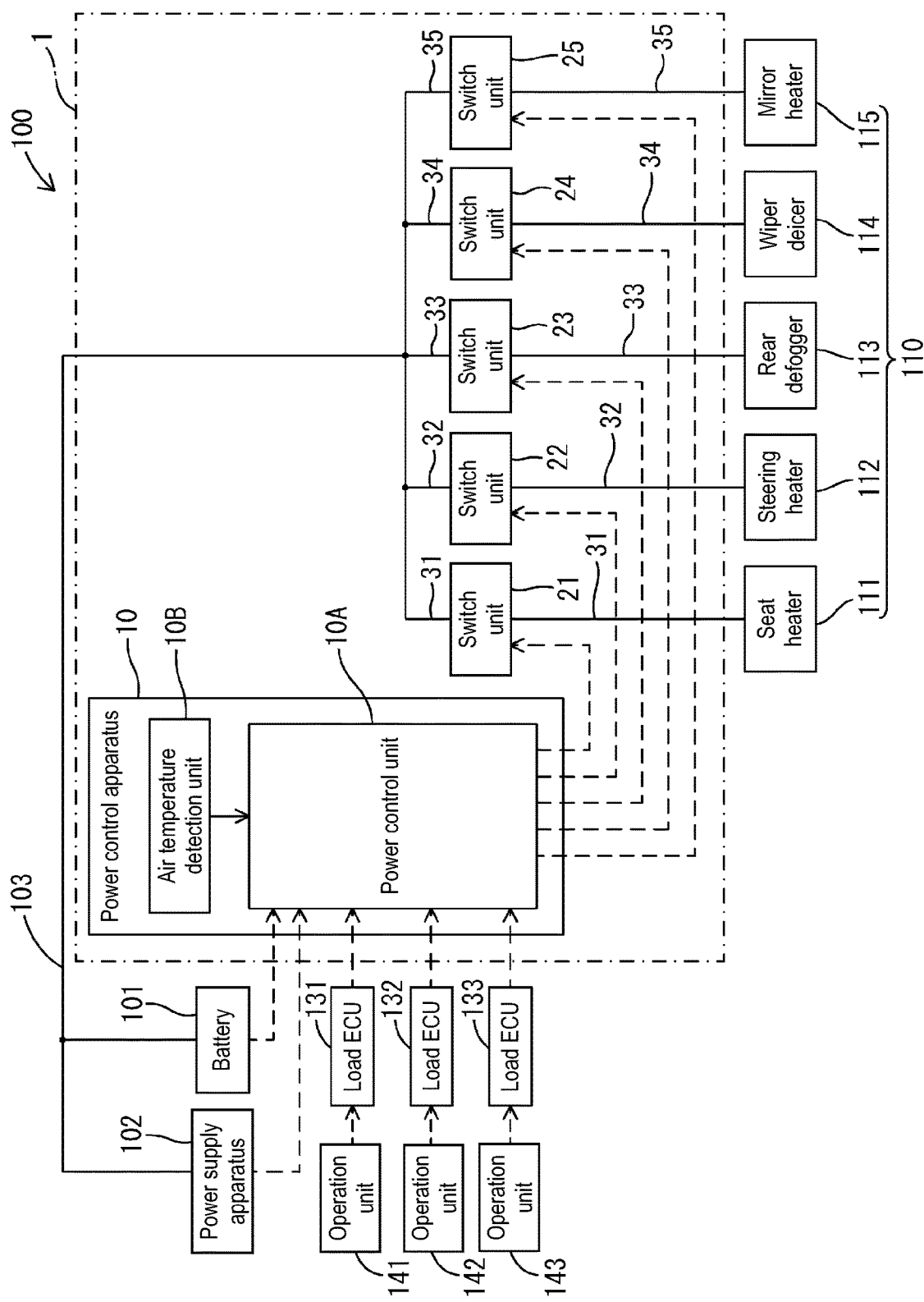
FIG. 1 is a block diagram schematically illustrating an on-board system that includes an on-board power control apparatus and an on-board power control system according to a first embodiment.

Here, preferred examples of the disclosure will be described.

In the on-board power control apparatus according to the first aspect, the power control unit may include a priority level setting unit that sets priority levels regarding power supply to a plurality of loads. The duty ratio setting unit may be configured such that, when the prediction value of the output voltage of the battery is determined by the determination unit as being less than the threshold voltage value, the duty ratio setting unit selects, from among the plurality of loads, a certain number of target loads, in ascending order of priority levels, based on the content of settings of the priority level setting unit, such that the prediction value of the output voltage calculated using the voltage prediction value calculation method satisfies a predetermined increase condition, and the duty ratio setting unit resets the duty ratios so as to reduce the duty ratios of the control signals to be output to the switch units provided on the power supply paths to the target loads thus selected.

With this configuration, when the output voltage of the battery is predicted to be less than the threshold voltage value in the future and power supply to loads is to be stopped or suppressed, power supply to loads with lower priority levels are more likely to be suppressed or stopped, and power supply to loads with higher priority levels are more likely to be maintained.

In an on-board power control apparatus with such a configuration, the power control unit may further include an SOC detection unit that detects a value that can specify an SOC (State Of Charge) of the battery. The duty ratio setting unit may be configured such that, when the prediction value of the output voltage of the battery is determined by the determination unit as being less than the threshold voltage value and the SOC of the battery is less than the predetermined threshold SOC value, the duty ratio setting unit selects, from among the plurality of loads, a certain number of target loads, in ascending order of priority levels, based on the content of settings of the priority level setting unit, such that the prediction value of the output voltage calculated using a voltage prediction value calculation method satisfies an increase condition and the prediction value of the output current from the battery calculated using a predetermined current prediction value calculation method satisfies a predetermined reduction condition, and the duty ratio setting unit resets the duty ratios so as to reduce the duty ratios of the control signals to be output to the switch units provided on the power supply paths to the target loads thus selected.

With this configuration, if it is predicted that the output voltage of the battery will be less than the threshold voltage value in the future and the SOC of the battery is less than a predetermined level at the moment, power supply to loads can be suppressed according to the priority levels, considering not only the prediction value of the output voltage of the battery, but also the prediction value of the output current from the battery. Therefore, it is possible to stop or prevent the output voltage of the battery from becoming too low, and to stop or prevent an excessive current from being further output in a state where the SOC is low. Thus, it is possible to realize such power suppression using a method with which power supply to loads with high priority levels is likely to be maintained.

Any of the configurations according to the first aspect and the second aspect in which the on-board power control apparatus includes the priority level setting unit may include an air temperature detection unit that detects an air temperature. If this is the case, the priority level setting unit may include a storage unit that stores correspondence information that defines a plurality of priority level setting methods and a plurality of temperature conditions associated with each other, and set priority levels of power supply to the plurality of loads based on the air temperature detected by the air temperature detection unit and the correspondence information stored in the storage unit, using a priority level setting method corresponding to the air temperature detected by the air temperature detection unit.

With this configuration, it is possible to change the priority level setting method according to the temperature, and select a load for which power supply is to be suppressed or stopped, based on the priority levels that are suitable for the air temperature.

First Embodiment

The following describes a first embodiment, which is a specific example of the present disclosure.

An on-board system 100 shown in FIG. 1 includes a battery 101, a power supply apparatus 102, a first conductive path 103, a power control system 1, and so on, and is configured as a system that can supply power to a plurality of loads 110. The power control system 1 operates to control power supply from the first conductive path 103, which is electrically connected to the battery 101, to the plurality of loads 110.

The battery 101 functions as an on-board power supply unit, and functions as a power supply for supplying power to various targets. The battery 101 is configured as a well-known on-vehicle power storage unit such as a lead battery, for example. The terminal on the high potential side is electrically connected to the first conductive path 103, and applies a predetermined output voltage to the first conductive path 103. The terminal on the low potential side of the battery 101 is electrically connected to ground in the vehicle, for example, which is not shown. Note that fuses, ignition switches, etc. are omitted from FIG. 1.

The power supply apparatus 102 is an apparatus that can supply a charging current to the battery 101. If the vehicle on which the on-board system 100 is mounted is an internal combustion engine vehicle, a well-known on-vehicle generator such as an alternator is an example of the power supply apparatus 102. If the vehicle on which the on-board system 100 is mounted is a hybrid vehicle or an electric vehicle, for example, a DC-DC converter that can perform voltage conversion on power supplied from a main battery (a battery other than the battery 101), which is not shown, and supply the power to battery 101 and the loads is an example of the power supply apparatus 102.

The plurality of loads 110 are configured as well-known on-board loads. In the example shown in FIG. 1, the plurality of loads 110 include well-known on-board loads such as a seat heater 111, a steering heater 112, a rear defogger 113, a wiper deicer 114, and a mirror heater 115.

The power control system 1 is an example of the on-board power control system. The power control system 1 mainly includes a power control apparatus 10, switch units 21, 22, 23, 24, and 25, and power supply paths (second conductive paths) 31, 32, 33, 34, and 35.

The power supply paths (second conductive paths) 31, 32, 33, 34, and 35 are configured as power paths for supplying (distributing) the power supplied from the battery 101, to the plurality of loads 110. All of the plurality of power supply paths (second conductive paths) 31, 32, 33, 34, and 35 are electrically connected to the first conductive path 103 and are configured to branch from the first conductive path 103, and respectively supply power to corresponding loads that correspond thereto. In the example shown in FIG. 1, the power supply path 31 is configured as a power supply path to the seat heater 111 (hereinafter also referred to as a load 111), which is a first load, the power supply path 32 is configured as a power supply path to the steering heater 112 (hereinafter also referred to as a load 112), which is a second load, the power supply path 33 is configured as a power supply path to the rear defogger 113 (hereinafter also referred to as a load 113), which is a third load, the power supply path 34 is configured as a power supply path to the wiper deicer 114 (hereinafter also referred to as a load 114), which is a fourth load, and the power supply path 35 is configured as a power supply path to the mirror heater 115 (hereinafter also referred to as a load 115), which is a fifth load. Although FIG. 1 shows an example in which one corresponding load is provided for each of the power supply paths 31, 32, 33, 34, and 35, two or more corresponding loads may be provided.

The plurality of switch units 21, 22, 23, 24, and 25 are respectively provided on the plurality of power supply paths 31, 32, 33, 34, and 35, and are respectively configured to switch the plurality of power supply paths 31, 32, 33, 34, and 35 to a conductive state and a non-conductive state. All of the plurality of switch units 21, 22, 23, 24, and 25 are individually controlled by a power control unit 10A. The switch units 21, 22, 23, 24, and 25 bring the power supply paths (the second conductive paths) corresponding thereto into a conductive state (an ON state) when receiving a conduction instruction (an ON instruction) from the power control unit 10A, and bring the power supply paths corresponding thereto into a non-conductive state (an OFF state) when receiving a non-conduction instruction (an OFF instruction). Each of the plurality of switch units 21, 22, 23, 24, and 25 may be configured as a semiconductor switch such as an FET (Field Effect Transistor), or a DC-DC converter that includes such a semiconductor switch.

The following describes an example in which each of the plurality of switch units 21, 22, 23, 24, and 25 is configured as a semiconductor switch. In the example shown in FIG. 1, when the switch unit 21 is in an ON state, power is supplied to the associated load (the load 111) that is associated with the power supply path 31 as a result of the power supply path 31 being in a conductive state, and when the switch unit 21 is in an OFF state, power supply to the associated load (the load 111) that is associated with the power supply path 31 is blocked as a result of the power supply path 31 being in a non-conductive state (a power supply blocking state). Similarly, when the switch unit 22 is in an ON state, power is supplied to the associated load (the load 112) that is associated with the power supply path 32 as a result of the power supply path 32 being in a conductive state, and when the switch unit 22 is in an OFF state, power supply to the associated load (the load 112) that is associated with the power supply path 32 is blocked as a result of the power supply path 32 being in a non-conductive state (a power supply blocking state). The other switch units 23, 24, and 25 operate in the same manner as the switch units 21 and 22.

The power control apparatus 10 is an example of the on-board power control apparatus, and operates to control power supply to the plurality of loads 110 based on an instruction from an apparatus (a plurality of load ECUs 131 to 135 in the example shown in FIGS. 1 and 2) located outside the power control system 1. The power control unit 10A, which is a primary part of the power control apparatus 10, is configured as, for example, a control circuit that includes a microcomputer or the like, has the functions of an information processing apparatus, and includes a control unit such as CPU, storage units such as a ROM and a RAM, and an AD converter, for example.

Figure 2:
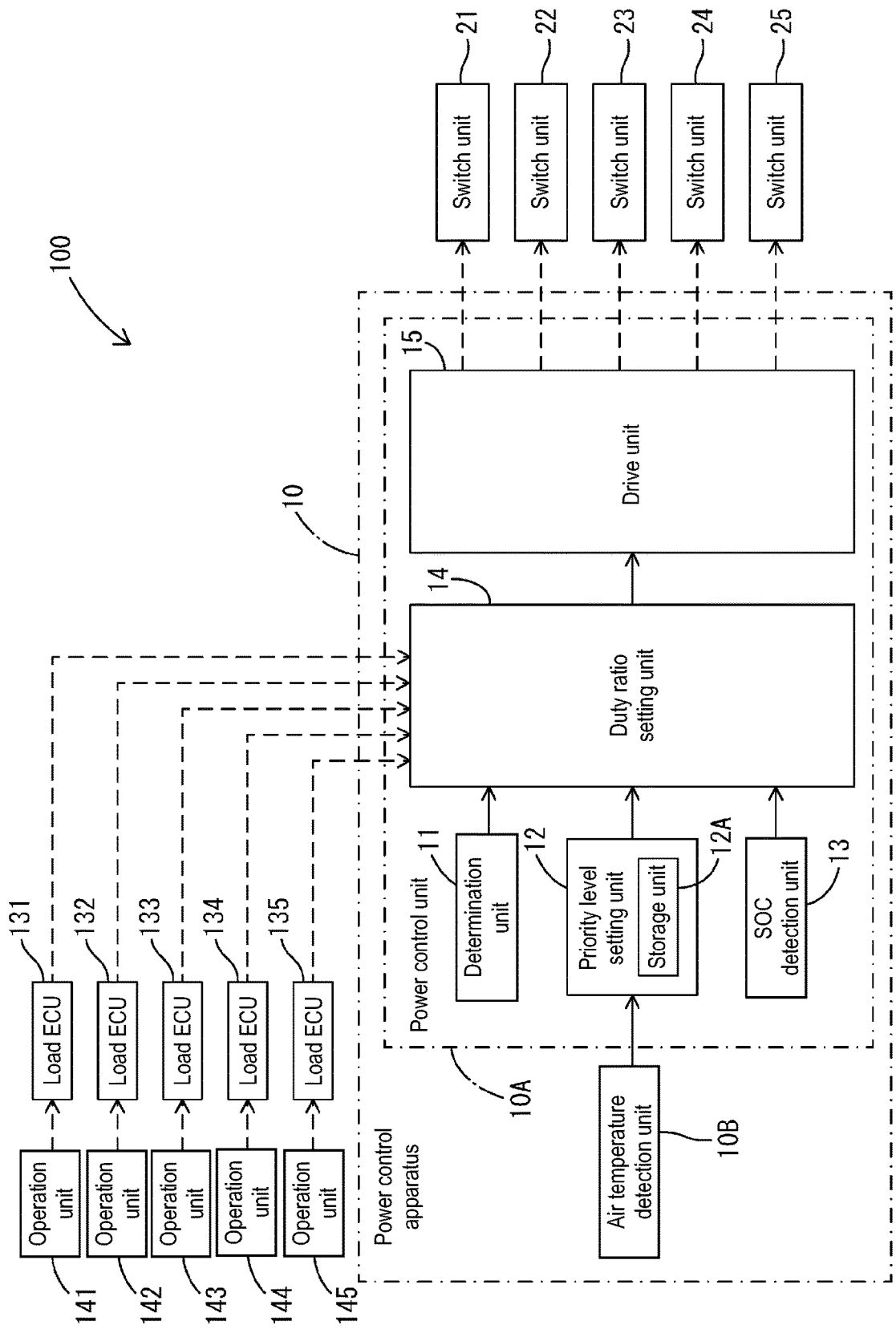
FIG. 2 is a block diagram conceptually showing functions performed by the power control apparatus.

As shown in FIGS. 1 and 2, the on-board system 100 includes operation units 141 to 145 that provide the plurality of loads with instructions to operate, and the load ECUs 131 to 135 that control operations of the loads based on instructions from the operation units 141 to 145. As shown in FIG. 2, the on-board system 100 includes, as the operation units 141 to 145, the operation unit 141 for performing an operation to instruct the seat heater 111 to operate, the operation unit 142 for performing an operation to instruct the steering heater 112 to operate, the operation unit 143 for performing an operation to instruct the rear defogger 113 to operate, the operation unit 144 for performing an operation to instruct the wiper deicer 114 to operate, and the operation unit 145 for performing an operation to instruct the mirror heater 115 to operate. Note that the operation units 144 and 145 are omitted from FIG. 1. As shown in FIG. 2, the on-board system 100 includes, as the plurality of load ECUs 131 to 135, the load ECU 131 that controls the operations of the seat heater 111 according to operations performed on the operation unit 141, the load ECU 132 that controls the operations of the steering heater 112 according to operations performed on the operation unit 142, the load ECU 133 that controls the operations of the rear defogger 113 according to operations performed on the operation unit 143, the load ECU 134 that controls the operations of the wiper deicer 114 according to operations performed on the operation unit 144, and the load ECU 135 that controls the operations of the mirror heater 115 according to operations performed on the operation unit 145. Each of the load ECUs 131 to 135 has the function of transmitting information that can specify an instruction from the operation unit corresponding thereto, to the power control unit 10A. For example, if each of the operation units 141 to 145 is configured to output a Hi instruction (an instruction to operate with relatively high power), a Lo instruction (an instruction to operate with relatively low power), and an OF instruction (an instruction to stop operating) to the load corresponding thereto, each of the load ECUs 131 to 135 can inform the power control unit 10A of which instruction is provided from the operation unit corresponding thereto.

Next, the functions of the power control apparatus 10 will be described.

The power control apparatus 10 is an apparatus that can control power supply from the battery 101 to the plurality of loads 110, and includes the power control unit 10A and an air temperature detection unit 10B.

As shown in FIG. 2, the power control unit 10A mainly has the functions of a determination unit 11, a priority level setting unit 12, an SOC detection unit 13, a duty ratio setting unit 14, and a drive unit 15. The power control unit 10A is configured to be able to output cyclic control signals (specifically, PWM signals, for example) such that an ON signal and an OFF signal are alternatingly output to each of the plurality of switch units 21, 22, 23, 24, and 25, and is configured to control the duty ratio of each of the control signals respectively supplied to the plurality of switch units 21, 22, 23, 24, and 25.

The air temperature detection unit 10B is constituted by a temperature sensor that is installed at a predetermined position inside or outside the vehicle on which the power control apparatus 10 is mounted, and that detects the temperature at the predetermined position (the installation position). The air temperature detection unit 10B is configured to output a voltage signal that specifies the temperature at the installation position. The following describes an example in which the air temperature detection unit 10B is configured as a well-known ambient temperature sensor.

Here, power control performed by the power control unit 10A will be described with reference to FIG. 3, for example.

Figure 3:
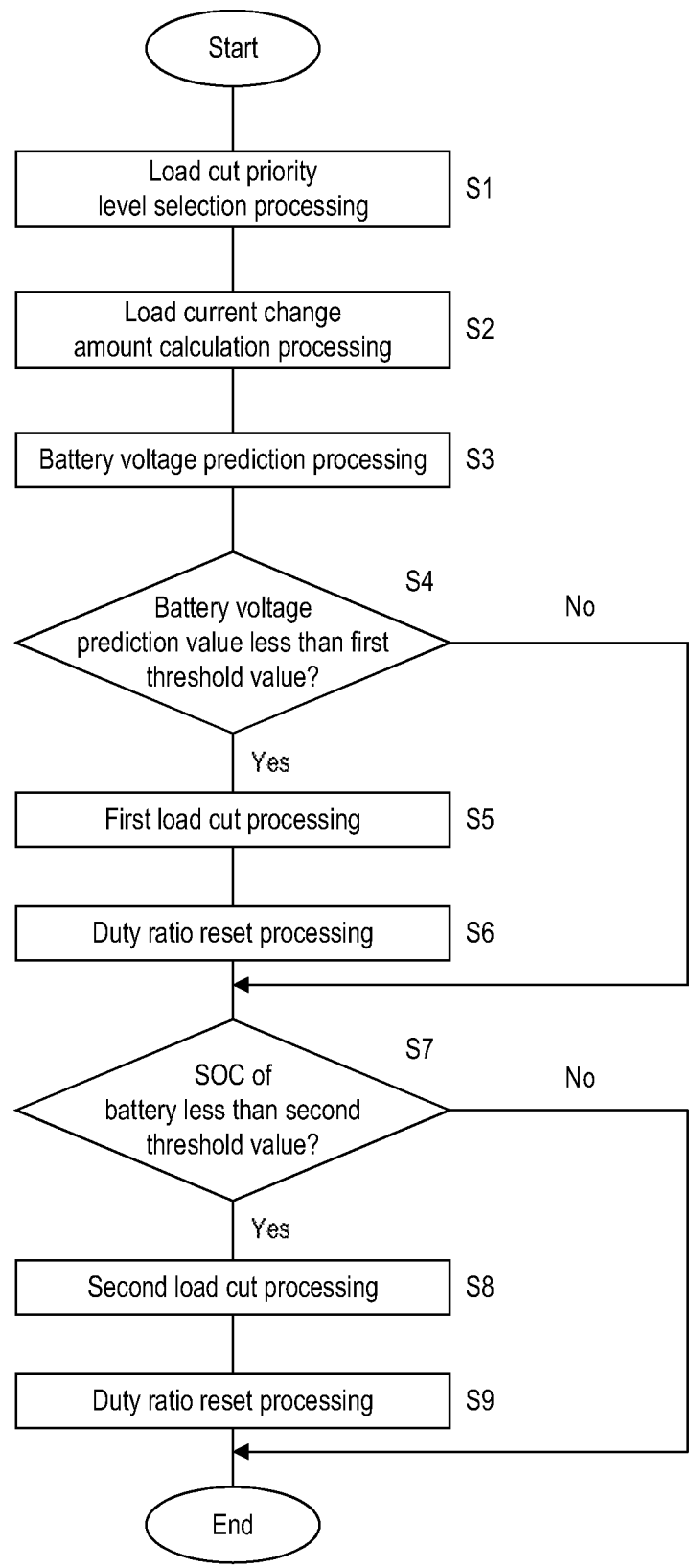
FIG. 3 is a flowchart illustrating a flow of power control performed by the power control apparatus.

The power control unit 10A performs the power control shown in FIG. 3 when a predetermined start condition is satisfied (for example, when a vehicle start switch (such as an ignition switch) is switched from an OFF state to an ON state), and repeats the power control shown in FIG. 3 until a predetermined end condition is satisfied (for example, until the vehicle start switch (such as the ignition switch) is switched from an ON state to an OFF state).

After starting the power control shown in FIG. 3, the power control unit 10A performs load cut priority level selection processing in step S1. The power control unit 10A performs the load cut priority level selection processing in step S1 according to the flow shown in FIG. 4, for example. After starting the processing in FIG. 4, the power control unit 10A, in step S10, first acquires information regarding the air temperature (for example, the ambient temperature) detected by the air temperature detection unit 10B, and thereafter, in step S11, determines whether or not the air temperature (for example, the ambient temperature) detected by the air temperature detection unit 10B is no less than a predetermined threshold temperature Tth. Upon determining that the air temperature detected by the air temperature detection unit 10B is no less than the predetermined threshold temperature Tth in step S11, the power control unit 10A selects a first table (a summer cut table) in step S12. Upon determining that the air temperature detected by the air temperature detection unit 10B is less than the predetermined threshold temperature Tth in step S11, the power control unit 10A selects a second table (a winter cut table) in step S13.

The second table (the winter cut table) is table data shown in FIG. 9(A), for example, and the first table (the summer cut table) is table data shown in FIG. 9(B), for example. Both the first table and the second table define values indicating priority ranks (priority numbers) in association with the loads. In both of the examples shown in FIGS. 9(A) and 9(B), the priority level increases as the value (the priority number) indicating a priority rank increases, and the priority level decreases as the value indicating a priority rank decreases. Furthermore, in both of the examples shown in FIGS. 9(A) and 9(B), for each load, a current when the duty ratio is 100% (a current that is predicted to flow to the load when the duty ratio of the control signal supplied to the switch provided on the power supply path to the load (i.e. when the control signal is kept in an ON state) is 100%) has been associated with the load in advance. For example, a current value Ia1 associated with the seat heater in the second table (the winter cut table) is the value of a current that is predicted to flow through the seat heater 111 when the duty ratio of the control signal supplied to the switch unit 21 provided on the power supply path 31 to the seat heater 111 is 100%. Furthermore, a value of a duty ratio at each load cut level is associated with each load. In both of the examples shown in FIGS. 9(A) and 9(B), the load cut level is 0, 1, or 2. For each load, the load cut level of 0 is associated with the duty ratio of 100%. Also, for each load, the load cut level of 1 is associated with a duty ratio that is lower than when the load cut level is 0. Also, for each load, the load cut level of 2 is associated with a duty ratio that is the same as or lower than when the load cut level is 1.

Figure 4:
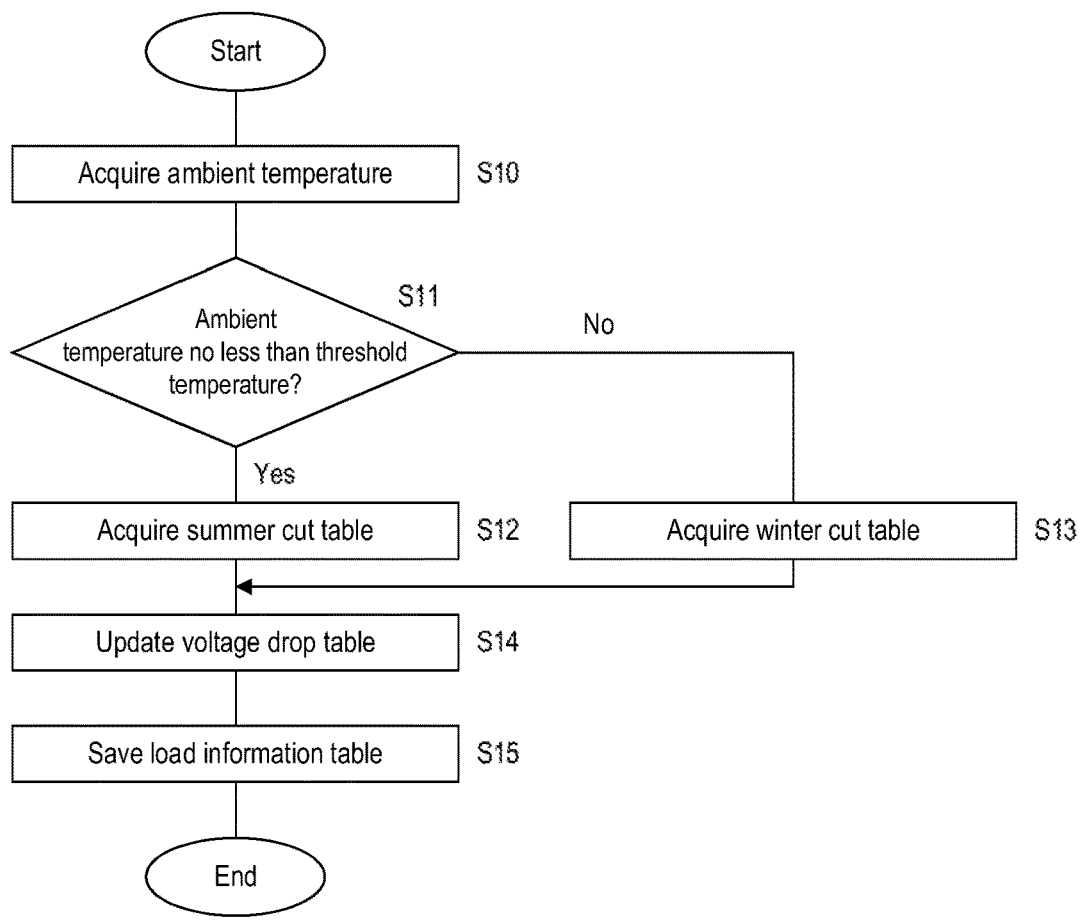
FIG. 4 is a flowchart illustrating a flow of load cut priority level selection processing performed in the power control shown in FIG. 3.

After step S12 or S13 shown in FIG. 4, the power control unit 10A, in step S14, generates a voltage drop table based on a current table (a table indicating, for each load, a predicted current when power is supplied to the load at the duty ratio of 100%) for the table selected in step S12 or S13 and the internal resistance of the battery. For example, in the case where the processing in step S14 is performed after the second table (the winter cut table) has been selected in step S13, the current table for the second table (the winter cut table) is referenced as shown in FIG. 10(A), and the voltage drop table is updated as shown in FIG. 10(B). In the example in FIG. 10(B), current values Ia1 to Ia5 respectively associated with the loads in the second table (the winter cut table) selected in step S13 are each multiplied by an internal resistance value Rb of the battery 101, and thus a table in which the results of multiplication are respectively associated with the loads is generated. This table is the voltage drop table. That is to say, the voltage drop table shows, for each load, the amount of voltage drop that is predicted to occur in the battery 101 due to a current flowing through the load when power is supplied to the load at the duty ratio of 100%. Note that the internal resistance value Rb of the battery 101 may be detected by an internal resistance value detection unit, which is not shown, using a well-known method, or by enabling the power control unit 10A to function as the internal resistance value detection unit and using a well-known method.

After step S14, in step S15, the power control unit 10A saves the information included in the table selected in step S12 or S13, as a load information table.

The power control unit 10A performs load cut priority level selection processing in this way. Note that, in this configuration, parts (a CPU and a storage unit 12A) of the power control unit 10A that performs the processing in step S1 shown in FIG. 3 function as the priority level setting unit 12. The priority level setting unit 12 is a unit that has the function of setting the priority levels regarding power supply to the plurality of loads 110, and correspondence information (specifically a program for executing the processing shown in FIG. 4 and the pieces of table data shown in FIG. 9) that defines a plurality of priority level setting methods (specifically, the method of determining the priority level using the summer cut table and the method of determining the priority level using the winter cut table) and a plurality of temperature conditions (specifically, a first temperature condition that "the air temperature detected by the air temperature detection unit 10B is no less than the threshold temperature Tth" and a second temperature condition that "the air temperature detected by the air temperature detection unit 10B is less than the threshold temperature Tth") associated with each other is stored in the storage unit 12A. The priority levels of power supply to the plurality of loads 110 are set based on the air temperature detected by the air temperature detection unit 10B and the correspondence information stored in the storage unit 12A, using the priority level setting method corresponding to the air temperature detected by the air temperature detection unit 10B.

After step S1 shown in FIG. 3, the power control unit 10A performs load current change amount calculation processing in step S2. The power control unit 10A performs load current change amount calculation processing in step S2 according to the flow shown in FIG. 5, for example. After starting the processing in FIG. 5, the power control unit 10A, in step S21, first calculates a duty ratio difference for each of the loads.

Figure 5:
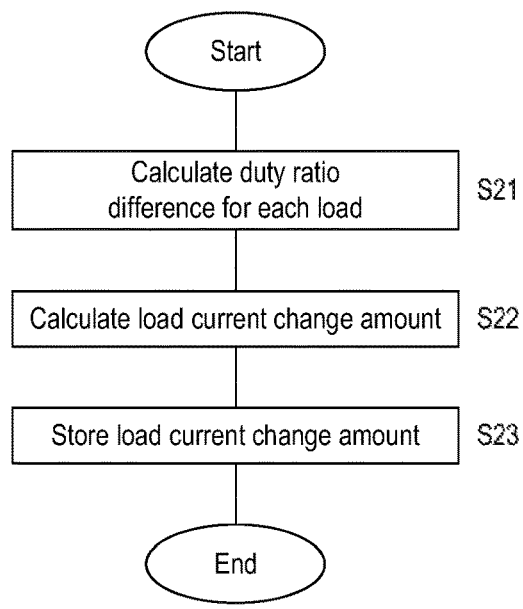
FIG. 5 is a flowchart illustrating a flow of load current change amount calculation processing performed in the power control shown in FIG. 3.

After step S21 shown in FIG. 5, the power control unit 10A calculates a load current change amount in step S22. The load current change amount is a value indicating the amount of a change in the total amount of the current flowing through the plurality of loads 110 between when the duty ratios of power supply to the loads (the duty ratios of the control signals supplied to the switches corresponding to the loads) were set for the previous control (the power control shown in FIG. 3 performed before the power control shown in FIG. 3 that is currently being performed) and when the duty ratios of power supply to the loads (the duty ratios of power supply to the loads set according to instructions from the operation units) are set for the control that is being performed this time (the power control shown in FIG. 3 that is currently performed).

In this configuration, the operation units 141 to 145 shown in FIG. 2 are examples of the load state setting unit, and the operation states of the loads 111 to 115 can be respectively specified by the operation units 141 to 145. Specifically, the operation states of the loads 110 can be set by the operation units associated therewith, to three levels, i.e. Hi, Lo, and stop. Regarding power control for any of the loads 110, the power control unit 10A controls power supply to the load 110 using the duty ratio corresponding to the instruction from the operation unit associated with the load 110 unless the load 110 is the target load of power cut. For example, regarding power supply to a load to which a Hi instruction has been supplied by an operation unit, the control signal to be supplied to the switch unit associated with the load is set so that power supply to the load will be performed with a duty ratio of 100% unless the load is the target load of power cut. Regarding power supply to a load to which a Lo instruction has been supplied by an operation unit, the control signal to be supplied to the switch unit associated with the load is set so that power supply to the load will be performed with a duty ratio of 50% unless the load is the target load of power cut. Regarding a load to which a stop instruction has been supplied by an operation unit, the control signal to be supplied to the switch unit associated with the load is kept in an OFF state (i.e. a signal with the duty ratio of 0% is continuously supplied). For example, if a Hi instruction has been provided by the operation unit 141, the duty ratio of the control signal to be supplied to the switch unit 21 associated with the seat heater 111 is set to 100% unless the seat heater 111 corresponding to the operation unit 141 is a load cut target load. If a Lo instruction has been provided by the operation unit 141, the duty ratio of the control signal to be supplied to the switch unit 21 associated with the seat heater 111 is set to 50% unless the seat heater 111 is a load cut target load. If a stop instruction has been provided by the operation unit 141, the duty ratio of the control signal to be supplied to the switch unit 21 associated with the seat heater 111 is set to 0%. Such setting of the duty ratio is applied to instructions from the operation units 142 to 145 in the same manner.

When calculating a load current change amount in step S22, the power control unit 10A determines the duty ratios to be allocated to the loads 111 to 115 (i.e. the duty ratios of the control signals to be supplied to the switch units 21 to 25 respectively associated with the loads 111 to 115), based on what instructions have been provided by the plurality of operation units 141 to 145 (i.e. based on whether each of the instructions provided by the plurality of operation units 141 to 145 is an Hi instruction, a Lo instruction, or a stop instruction). Using such a method, it is possible to determine the duty ratios corresponding to the instructions provided by the plurality of operation units 141 to 145 at the time of the current control (the current control shown in FIG. 3) (the duty ratios to be supplied to the switch units 21 to 25 respectively corresponding to the operation units 141 to 145). When the duty ratios corresponding to the instructions provided by the plurality of operation units 141 to 145 at the time of the current control (the current control shown in FIG. 3) (the duty ratios of the control signals to be supplied to the switch units 21 to 25 respectively corresponding to the instructions provided by the plurality of operation units 141 to 145) are denoted as D21, D22, D23, D24, and D25, and the duty ratios of the control signals respectively supplied to the switch units 21 to 25 corresponding to the loads 111 to 115 in the previous control (the control shown in FIG. 3 performed before the current control shown in FIG. 3 is performed) are denoted as D11, D12, D13, D14, and D15, the duty ratio differences of power supply to the loads 111 to 115, i.e. the respective differences in the duty ratios of the control signals to be supplied to the switch units 21 to 25 (differences between the duty ratios of the control signals supplied to the switch units 21 to 25, determined in the previous control shown in FIG. 3, and the duty ratios of the control signals to be supplied to the switch units 21 to 25, determined according to the instructions that have been provided by the plurality of operation units 141 to 145 at the time of current control shown in FIG. 3) can be respectively represented as D21-D11, D22-D12, D23-D13, D24-D14, and D25-D15, respectively, as shown in FIG. 11. Thereafter, the total amount of a change in the load current flowing through the plurality of loads 111 to 115 (a load current change amount $\Delta Ia$) when the duty ratios determined in the previous control in FIG. 3 are changed to the duty ratios corresponding to the instructions (instructions from the plurality of operation units 141 to 145) provided at the time of the current control in FIG. 3 is obtained. Specifically, the difference duty ratios of the loads respectively calculated as shown in FIG. 11 are each multiplied by the amount of the current flowing through the load corresponding thereto (the amount of current estimated to flow through the corresponding load when the duty ratio is 100%), defined in the table selected in step S12 or S13, and thus the current change amounts $\Delta I1$ to $\Delta I5$ are respectively calculated for the loads as shown in FIG. 12. The total of the current change amounts $\Delta I1$ to $\Delta I5$ is determined as the above-described load current change amount $\Delta Ia$. After calculating the load current change amount in step S22, the power control unit 10A stores the calculated load current change amount in the storage unit in step S23. Note that the current change amounts $\Delta I1$ to $\Delta I5$ are positive values if the duty ratios for the loads increase from when the previous determination (setting) in FIG. 3 was performed to when the current instructions (the instructions from the plurality of operation units 141 to 145 at the time of FIG. 3) are provided, and are negative values if the duty ratios for the loads decrease, and are 0 if the duty ratios do not change. The load current change amount $\Delta Ia$ is a positive value if the total load current of the loads 111 to 115 increases from when the previous determination (setting) in FIG. 3 was provided to when the current instructions (the instructions from the plurality of operation units 141 to 145 at the time of FIG. 3) are provided, and is a negative value if the total load current decreases, and is 0 if the total load current does not change.

After step S2 shown in FIG. 3, the power control unit 10A performs battery voltage prediction processing in step S3. The power control unit 10A performs the battery voltage prediction processing in step S3 according to the flow shown in FIG. 6, for example. After starting the processing in FIG. 6, the power control unit 10A, in step S31, first calculates a prediction value Ix of the battery current change amount (a predicted battery current change amount). Specifically, the power control unit 10A calculates the prediction value Ix of the battery current change amount, using a formula Ix=$\Delta$Ia+In·Im, based on the load current change amount $\Delta$Ia obtained using the above-described method, an output current In from the power supply apparatus 102 (for example, a DC-DC converter for an auxiliary device) at the moment, and a maximum current Im output from the power supply apparatus 102. Note that the output current In from the power supply apparatus 102 may be detected by a current sensor (not shown) or detected or calculated using another well-known method. The maximum current Im may be a predetermined maximum value (for example, the maximum rated current of the power supply apparatus 102).

Figure 6:
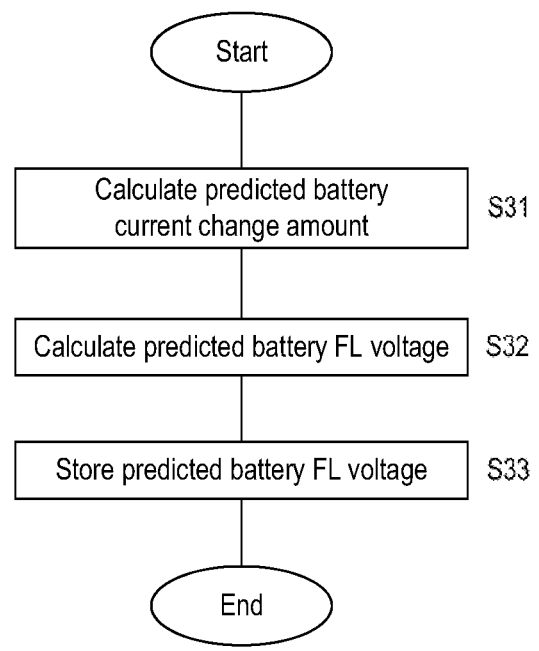
FIG. 6 is a flowchart illustrating a flow of battery voltage prediction processing performed in the power control shown in FIG. 3.

After step S31, the power control unit 10A calculates a predicted battery FL voltage (a predicted voltage of the battery in a fully-charged state) Vx in step S32. The predicted battery FL voltage Vx can be calculated using a formula Vx=−Ix×Rb+Vnf, based on the prediction value of the battery current change amount (the predicted battery current change amount) Ix calculated in step S31, the internal resistance Rb of the battery 101, and a battery FL terminal voltage Vnf at the moment. After calculating the predicted battery FL voltage Vx in step S32, the power control unit 10A stores the predicted battery FL voltage Vx in step S33. Note that Vnf is the charged voltage (the terminal voltage) of the battery 101 in a fully-charged state at the current point in time (at the time when or immediately before the control shown in FIG. 6 is performed) and the charge voltage in a fully-charged state can be obtained by using a well-known method. Alternatively, the charged voltage of the battery 101 at the time of step S32 may be used instead.

After step S3 shown in FIG. 3, the power control unit 10A performs determination processing in step S4. Specifically, in step S4, the power control unit 10A determines whether or not the predicted battery FL voltage Vx calculated in step S3 or the battery FL terminal voltage Vnf at the moment is less than a predetermined first threshold value. Upon determining that the predicted battery FL voltage Vx or the battery FL terminal voltage Vnf at the moment is less than the first threshold value in step S4, the power control unit 10A performs first load cut processing in step S5. Upon determining that neither the predicted battery FL voltage Vx nor the battery FL terminal voltage Vnf at the moment is less than the first threshold value in step S4, the power control unit 10A proceeds to step S7.

Figure 7:
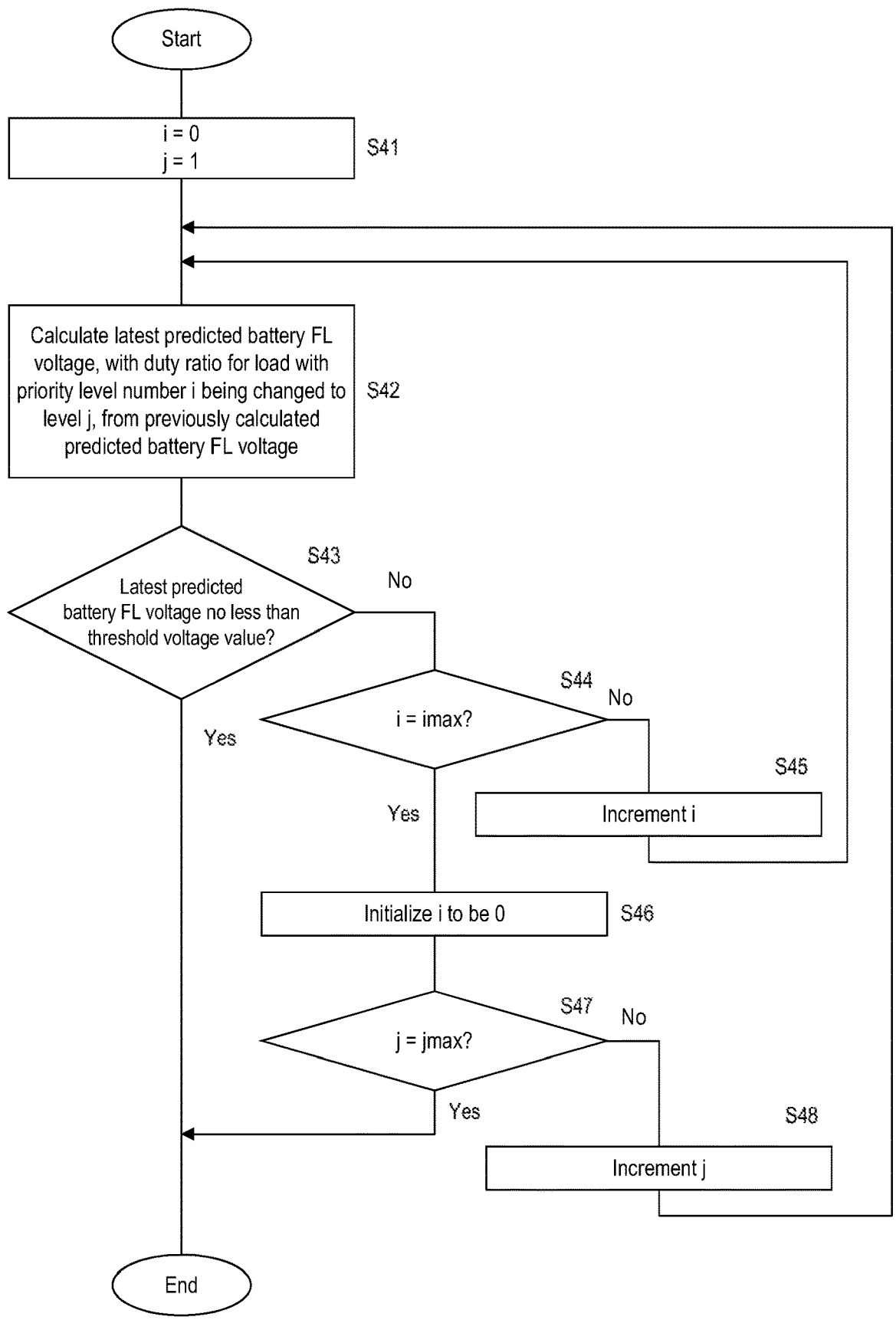
FIG. 7 is a flowchart illustrating a flow of first load cut processing performed in the power control shown in FIG. 3.

The power control unit 10A performs the first load cut processing in step S5 according to the flow shown in FIG. 7, for example. After starting the processing in FIG. 7, the power control unit 10A, in step S41, first performs initialization so that i=0 and j=1 are satisfied.

After step S41, the power control unit 10A performs the processing in step S42 to calculate the latest predicted battery FL voltage, with the duty ratio for the load with a priority level number i being changed to a level j, from the previously calculated predicted battery FL voltage. After step S42, the power control unit 10A performs the processing in step S43 to determine whether or not the latest predicted battery FL voltage is no less than a first threshold voltage value Vth.

Specifically, the power control unit 10A changes the duty ratio for the load with the priority level number i to the level j from the state in which the predicted battery FL voltage was previously calculated, and multiplies the difference between the duty ratios before and after the change (a value obtained by subtracting the duty ratio before being changed to the level j, from the duty ratio changed to the level j) by the amount of the current flowing through the load with the priority level number i when the duty ratio is 100% (the value specified by the table selected in step S12 or S13). Thus, the power control unit 10A can calculate a current change amount $\Delta$Is of the current flowing through the load with the priority level number i before and after the change. Note that, if the duty ratio decreases from before the change to after the change, the current change amount $\Delta$Is of the current flowing through the load with the priority level number i is a negative value, and if the duty ratio does not change before and after the change, the current change amount $\Delta$Is of the current flowing through the load with the priority level number i is 0. Upon the current change amount $\Delta$Is of the load with the priority level number i being calculated in this way, the power control unit 10A updates the load current change amount $\Delta$Ia of all of the loads 111 to 115 based on the current change amount $\Delta$Is of the load. Specifically, a value ($\Delta$Ia+$\Delta$Is) calculated by adding the current change amount $\Delta$Is of the load of the priority level number i to the load current change amount $\Delta$Ia at the time the predicted battery FL voltage was previously calculated is the new load current change amount $\Delta$Ia. Thereafter, the power control unit 10A performs the same processing as in steps S31 and S32 based on the new load current change amount $\Delta$Ia, calculates a newly predicted battery current change amount Ix, using the formula Ix=$\Delta$Ia+In −Im, and calculates the new predicted battery FL voltage Vx, using the formula Vx=−Ix×Rb+Vnf.

For example, in step S42 that is performed for the first time after the processing shown in FIG. 7 is started, the predicted battery FL voltage previously calculated is the predicted battery FL voltage Vx calculated in step S32. When the predicted battery FL voltage Vx calculated in step S32 is Vx0, i=0 and j=1 are satisfied in step S42 that is performed for the first time after step S32, and therefore the latest predicted battery FL voltage Vx is calculated for the load with the priority level number 0, with the duty ratio for the load being changed to the level 1. For example, in the case where the winter cut table shown in FIG. 9(A) is used, when the duty ratio for the load with the priority level number 0 is changed from the duty ratio calculated in step S32 (100%) to the duty ratio at the level 1 (50%), the current change amount $\Delta$Is (−Ia1×50%) before and after the duty ratio change can be calculated for the load with the priority level number 0, using the difference between the duty ratios before and after the change from the previous time for the load with the priority level number 0 (−50%) and the current value Ia1 at the time the duty ratio for the load was 100%. Thus, when the current change amount $\Delta$Is (−Ia1×50%) is calculated for the load with the priority level number 0, if the previous load current change amount at the time the predicted battery FL voltage was previously calculated was $\Delta$Ia, the new load current change amount is $\Delta$Ia+$\Delta$Is(−Ia1×50%). For example, if the previous load current change amount is $\Delta$Ia0, the new load current change amount $\Delta$Ia1 satisfies a relationship $\Delta Ia1=\Delta Ia0+\Delta Is$. When the new load current change amount $\Delta Ia1$ is determined in this way, this value is determined as an updated value $\Delta Ia$ of the load current change amount, and the new predicted battery FL voltage Vx is calculated by performing the same processing as in steps S31 and S32.

Upon determining that the new predicted battery FL voltage Vx calculated in step S42 is no less than the first threshold value (the threshold voltage value Vth) (Yes in step S43), the power control unit 10A terminates the processing in FIG. 7.

Upon determining that the new predicted battery FL voltage Vx calculated in step S42 is less than the first threshold value (the threshold voltage value Vth) (No in step S43), the power control unit 10A determines whether or not the number i (the priority level number) of the load is the maximum value (imax) in step S44. Upon determining that the number i (the priority level number) of the load is not the maximum value (imax) in step S44, the power control unit 10A increments the number i (the priority level number) of the load at the moment by 1 in step S45 and returns processing to step S42. Otherwise, the power control unit 10A initializes the number i (the priority level number) of the load to 0 in step S46, and thereafter determines whether or not the number j indicating the load cut level is the maximum value (jmax) in step S47. Upon determining that the number j indicating the level is not the maximum value (jmax) in step S47, the power control unit 10A increments the number j at the moment by 1 in step S48, and otherwise terminates the processing in FIG. 7.

After performing the processing in step S5 in FIG. 3 (the processing in FIG. 7), the power control unit 10A resets the duty ratios of the loads 110 in step S6. Specifically, the power control unit 10A sets the duty ratios for the loads 110 (the duty ratios of the control signals respectively supplied to the switches provided on the power supply paths to the loads 110) to values with which the latest predicted battery FL voltage Vx at the time the processing in FIG. 7 is complete can be obtained.

With this configuration, the unit that performs the processing in step S4 in FIG. 3 (specifically, the power control unit 10A) is an example of the determination unit 11, and the determination unit 11 is a unit that has the function of determining whether or not the predicted value of the output voltage of the battery 101 calculated using a predetermined voltage prediction value calculation method (the predicted battery FL voltage Vx at the time of step S32) is less than the threshold voltage value Vth based on the settings made by the load state setting unit that sets the respective operation states of the loads 110.

After performing step S6 shown in FIG. 3 or if the result of step S4 is No, the power control unit 10A performs determination processing in step S7. In step S7, the power control unit 10A determines whether or not the SOC (State Of Charge) of the battery 101 is less than a second threshold value (a threshold SOC value Sth). Upon determining that the SOC of the battery 101 is less than the second threshold value (the threshold SOC value Sth), the power control unit 10A performs the processing in step S8, and otherwise terminates the control in FIG. 3.

Note that, in this configuration, the unit that performs the processing in step S7 in FIG. 3 is an example of the SOC detection unit 13. The SOC detection unit 13 is a unit that has the function of detecting a value that can specify the SOC of the battery 101. The SOC of the battery 101 may be detected using any of various well-known detection methods.

Figure 8:
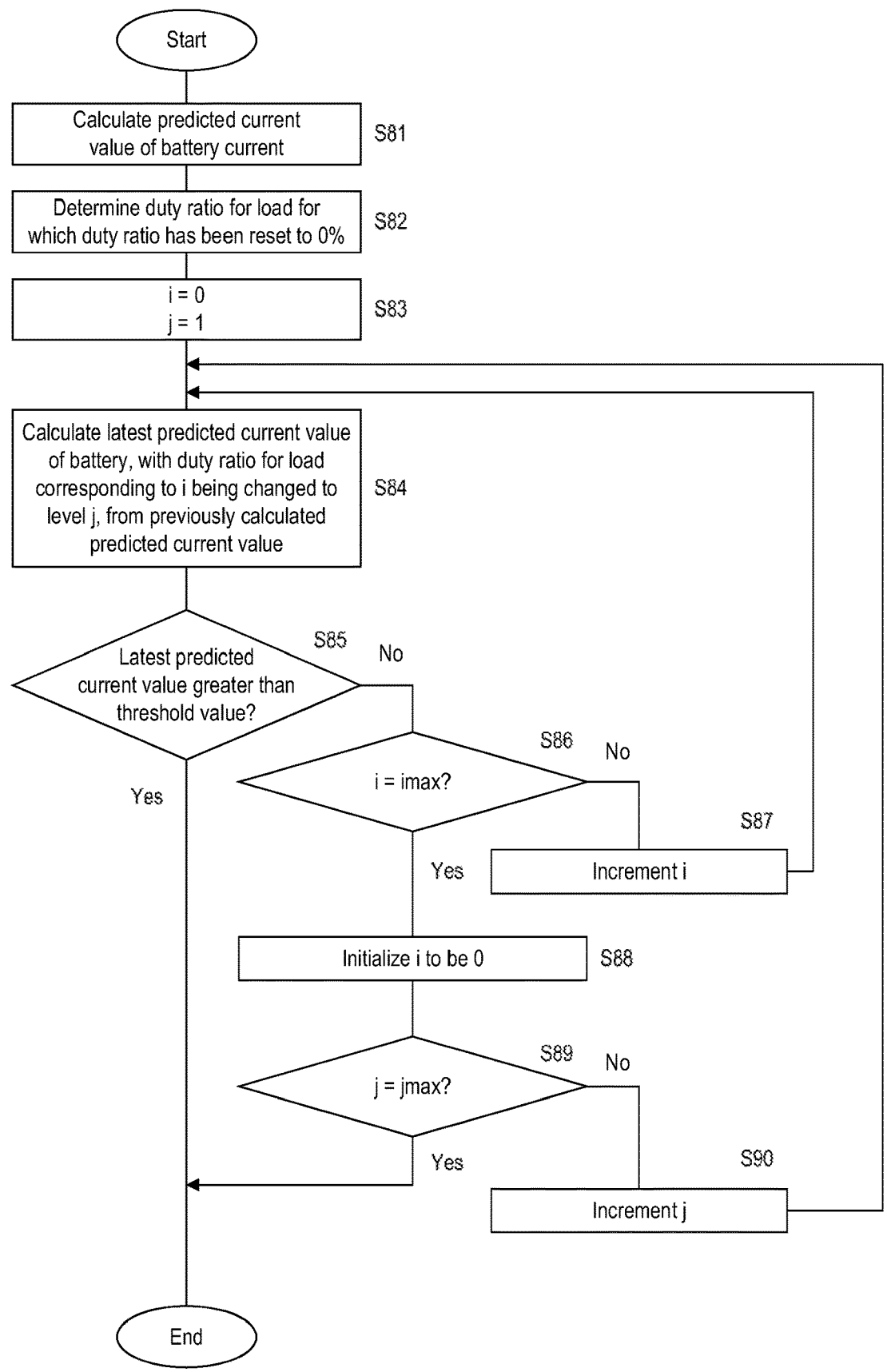
FIG. 8 is a flowchart illustrating a flow of second load cut processing performed in the power control shown in FIG. 3.

The power control unit 10A performs the processing in step S8 in FIG. 3 according to the flow shown in FIG. 8. First, the power control unit 10A calculates a predicted current value Ibat of the battery current in step S81, using a formula $Ibat=Ibn\cdot\Delta Iba$. Ibn is the buttery current of the battery 101 at the moment, and is a negative value when the battery 101 is discharged, and is a positive value when the battery 101 is charged. Note that a battery current detection unit that detects the battery current of the battery 101 using a well-known method is provided in the power control apparatus 10 or an external apparatus, and the power control apparatus 10 is configured to be able to acquire the battery current of the battery 101 from the battery current detection unit. $\Delta Iba$ is a battery current change amount indicating a change that occurs when the duty ratio is changed due to the resetting performed in the processing in FIG. 7, and $\Delta Iba$ is 0 if the resetting is not performed in the processing in FIG. 7. For example, if the duty ratios for the loads (the duty ratios of the control signals to be supplied to the switch units 21 to 25) have been reset in the control in FIG. 7, the predicted current value of the battery after the resetting is calculated in step S81, using the aforementioned formula Ibat=Ibn−$\Delta Iba$, based on the duty ratios that have been reset. Alba is a value calculated by multiplying the duty change amount of each load, which occurs due to the resetting performed in step S7 (the amount of a change from the duty ratio for the load (the duty ratio of the control signal supplied to the switch) in the previous control in FIG. 3 to the duty ratio for the load after the resetting in step S7 (the duty ratio of the control signal supplied to the switch)) by the value in the current table for the load (the current amount when the duty ratio for the load is 100%). For example, when the change amounts of the duty ratios for the loads 111 to 115 set through the processing in FIG. 7 (the amounts of changes from the previous control in FIG. 3) are $\Delta D1$, $\Delta D2$, $\Delta D3$, $\Delta D4$, and $\Delta D5$, and the current values set for the loads 111 to 115 in the current table are Ia1, Ia2, Ia3, Ia4, and Ia5, $\Delta Iba$ can be calculated through $\Delta Iba=\Delta D1\times Ia1+\Delta D2\times Ia2+\Delta D3\times Ia3+\Delta D4\times Ia4+\Delta D5\times Ia5$. In this case, $\Delta D1$, $\Delta D2$, $\Delta D3$, $\Delta D4$, and $\Delta D5$ are negative values if the duty ratios decrease. $\Delta Iba$ is a positive value when the amount of current taken from the battery increases due to these changes in the duty ratios, and is a negative value when the amount of current taken from the battery decreases. Note that, if the processing in FIG. 7 is not performed, $\Delta Iba$ is set to 0 at the time of step S81.

After performing step S81, the power control unit 10A performs arbitration processing in step S82. Specifically, if the processing in FIG. 7 has been performed and the duty ratio for any of the loads has been reset to 0%, the power control unit 10A determines the duty ratio for the load to be 0%. Thereafter, the power control unit 10A performs initialization in step S83 so that i=0 and j=1 are satisfied.

After step S83, the power control unit 10A performs the processing in step S84 to calculate the latest predicted current value Ibat of the battery, with the duty ratio for the load corresponding to the priority level number i being changed to the level j, from the previously calculated predicted current value Ibat of the battery. Thereafter, the power control unit 10A determines whether or not the latest predicted current value Ibat of the battery obtained in step S84 is greater than the threshold current value Ith in step S85. Note that, in step S84 that is performed for the first time after the processing in FIG. 8, the predicted current value Ibat of the battery obtained in step S81 is the previously calculated predicted current value of the battery, and in the second or later step S84, the predicted current value obtained in the previous step S84 is the previously calculated predicted current value of the battery.

Specifically, the duty ratio for the load with the priority level number i is changed to the level j from the state in which the previous predicted current value of the battery was calculated, and the current change amount ΔIc (a negative value when the duty ratio decreases) of the load with the priority level number i before and after the duty ratio change can be calculated by multiplying the difference between the duty ratios before and after the change (a negative value when the duty ratio decreases) for the load with the priority level number i by the current amount when the duty ratio for the load with the priority level number i is 100% (the value specified in the table selected in step S12 or S13). Upon the current change amount ΔIc for the load with the priority level number i, corresponding to the change in the duty ratios, being calculated in this way, Ibat−ΔIc is determined as the new predicted current value of the battery based on the previous predicted current value Ibat of the battery and the current change amount ΔIc for the load with the priority level number i calculated in this way. For example, when the previous predicted current value of the battery is Ibat0 and the current change amount according to the change in the duty ratio for the load with the priority level number i calculated in step S84 is ΔIc, the new predicted current value Ibat1 of the battery updated in step S84 is Ibat1=Ibat0−ΔIc. Note that when the load with i selected at the time of step S84 is the load for which the duty ratio was determined so as to be 0% in step S82, the predicted current value Ibat is not updated in step S84. Note that Ibat is a predicted value of the charging current of the battery 101, and a predicted value of the output current (discharging current) is −Ibat.

Upon determining in step S85 that the latest predicted current value Ibat of the battery is greater than the threshold current value Ith (Yes in step S85), the power control unit 10A terminates the processing in FIG. 8.

Upon determining that the latest predicted current value Ibat at the time of step S85 is no less than the threshold current Ith (No in step S85), the power control unit 10A determines whether or not the number i (the priority level number) for the load is the maximum value (imax) in step S86. Upon determining that the number i (the priority level number) for the load is not the maximum value (imax) in step S86, the power control unit 10A increments the number i (the priority level number) for the load by 1 in step S87, and otherwise initializes the number i (the priority level number) for the load to 0 in step S88, and thereafter determines whether or not the number j indicating the load cut level is the maximum value (jmax) in step S89. Upon determining that the number j indicating the level is not the maximum value (jmax) in step S89, the power control unit 10A increments the number j by 1 in step S90, and otherwise terminates the processing in FIG. 8.

After performing the processing in step S8 in FIG. 3 (the processing in FIG. 8), the power control unit 10A resets the duty ratios of the loads in step S9. Specifically, the power control unit 10A sets the duty ratios for the loads to the values with which the latest predicted current value Ibat at the time of the completion of the processing in FIG. 8 can be obtained. Furthermore, in step S9, the power control unit 10A lights up an indicator according to the load cut state. For example, if current to some of the loads that are requested by the user to operate is to be cut, the indicator is lit up in the first color (for example, yellow), and if current to all of the loads that are requested by the user to operate is to be cut (all of the loads are not to be operated), the indicator is lit up in the second color (for example, red).

In this configuration, the unit that performs the processing in steps S5, S6, S8, and S9 is an example of the duty ratio setting unit 14. The duty ratio setting unit 14 is a unit that has the function of setting the duty ratios of the control signals to be output to the plurality of switch units 21, 22, 23, 24, and 25. As described above, the duty ratio setting unit 14 is configured to set the duty ratios of the control signals to be output to the plurality of switch units 21, 22, 23, 24, and 25 based on the setting made by the load state setting unit, when the prediction value (the predicted battery FL voltage Vx at the time of step S32) of the output voltage of the battery 101 is determined by the determination unit 11 as being no less than the threshold voltage value and the predetermined condition is satisfied (the SOC is no less than the second threshold value). On the other hand, when the prediction value of the output voltage of the battery 101 (the predicted battery FL voltage Vx at the time of step S32) is determined by the determination unit 11 as being less than the threshold voltage value, the duty ratio setting unit 14 selects at least one of the plurality of loads 110 as a target load for which power supply is to be stopped or suppressed, and resets and reduces the duty ratio of the control signal to be output to the switch unit 21, 22, 23, 24, or 25 provided on the power supply path 31, 32, 33, 34, or 35 to the selected target load.

Also, when the prediction value of the output voltage of the battery 101 (the predicted battery FL voltage Vx at the time of step S32) is determined by the determination unit 11 as being less than the threshold voltage value and the SOC of the battery 101 is greater than the predetermined threshold SOC value, the duty ratio setting unit 14 performs both steps S5 and S8. The duty ratio setting unit 14 selects, from among the plurality of loads 110, a certain number of target loads, in ascending order of priority levels, based on the content of settings of the priority level setting unit 12, such that the prediction value of the output voltage calculated using a predetermined voltage prediction value calculation method satisfies an increase condition and the prediction value of the output current from the battery 101 calculated using a predetermined current prediction value calculation method (a prediction value of the discharged current from the battery 101, which is the value of −Ibat calculated in S84) satisfies a predetermined reduction condition, and resets the duty ratios so as to reduce the duty ratios of the control signals to be output to the switch units 21, 22, 23, 24, and 25 provided on the power supply paths 31, 32, 33, 34, and 35 to the target loads thus selected.

The drive unit 15 operates to output control signals (for example, PWM signals) with the duty ratios set by the duty ratio setting unit 14 in this way (values set as the duty ratios for the loads through the control shown in FIG. 3) to the plurality of switch units 21, 22, 23, 24, and 25.

The following illustrates the effects of the present configuration.

In the above-described power control apparatus 10, when the prediction value of the output voltage of the battery 101 is determined by the determination unit 11 as being less than the first threshold value (the threshold voltage value Vth), at least one of the plurality of loads 110 is selected as a target load for which power supply is to be stopped or suppressed, and the duty ratio of the control signal to be output to the switch unit provided on the power supply path to the selected target load is reset so as to be smaller than the duty ratio that is originally set for the target load (the duty ratio to be provided according to the instruction from the operation unit corresponding to the load ECU that controls the operation of the target load). With such a configuration, if it is predicted that the output voltage of the battery 101 will be less than the threshold voltage value in the future, power supply to at least one of the loads 110 can be stopped or suppressed, and thus the output voltage predicted to decrease in the future can be improved. Therefore, it is possible to stop or prevent the output voltage of the battery 101 from becoming too low, and make it less likely that a problem will be caused by a decrease in the output voltage of the battery 101.

Specifically, the power control unit 10A includes a priority level setting unit 12 that sets priority levels of power supply to the plurality of loads 110. When the prediction value of the output voltage of the battery 101 is determined by the determination unit 11 as being less than the threshold voltage value Vth, the duty ratio setting unit 14 selects, from among the plurality of loads 110, a certain number of target loads, in ascending order of priority levels, based on the content of settings of the priority level setting unit 12, such that the prediction value of the output voltage calculated using a predetermined voltage prediction value calculation method satisfies a predetermined increase condition, and the duty ratio setting unit 14 resets the duty ratios so as to reduce the duty ratios of the control signals to be output to the switch units provided on the power supply paths to the target loads thus selected.

With this configuration, when the output voltage of the battery 101 is predicted to be less than the threshold voltage Vth in the future and power supply to loads is to be stopped or suppressed, power supply to loads with lower priority levels are more likely to be suppressed or stopped in advance, and power supply to loads with higher priority levels are more likely to be maintained.

Also, in the on-board power control apparatus 10, when the SOC of the battery 101 is less than the threshold SOC value Sth, the duty ratio setting unit 14 selects a certain number of target loads for which power supply is to be stopped or suppressed, in ascending order of priority levels, based on the content of settings of the priority level setting unit 12, such that a prediction value of an output current from the battery 101 satisfies a predetermined reduction condition, and the duty ratio setting unit 14 resets the duty ratios so as to reduce the duty ratios of the control signals to be output to the switch units provided on the power supply paths to the target loads thus selected. With such a configuration, if the SOC of the battery 101 is less than the predetermined level, it is possible to stop or suppress power supply to loads, and stop or prevent an excessive current from being further output in a state where the SOC is low. In addition, a certain number of target loads for which power supply is to be stopped or suppressed are selected in ascending order of priority levels such that the prediction value of the output current from the battery 101 satisfies the predetermined reduction condition. Therefore, it is easier to prevent the SOC from being too low while maintaining power supply to loads with high priority levels as much as possible.

Specifically, when the prediction value of the output voltage of the battery 101 is determined by the determination unit 11 as being less than the threshold voltage value Vth and the SOC of the battery 101 is less than the predetermined threshold SOC value, the duty ratio setting unit 14 selects, from among the plurality of loads 110, a certain number of target loads, in ascending order of priority levels, based on the content of settings of the priority level setting unit 12, such that the prediction value of the output voltage calculated using a voltage prediction value calculation method satisfies a predetermined increase condition and the prediction value of the output current from the battery 101 calculated using a predetermined current prediction value calculation method satisfies a predetermined reduction condition, and the duty ratio setting unit 14 resets the duty ratios so as to reduce the duty ratios of the control signals to be output to the switch units provided on the power supply paths to the target loads thus selected. With this configuration, when the output voltage of the battery 101 is predicted to be less than the threshold voltage Vth in the future and the SOC of the battery 101 at the moment is less than a predetermined level, power supply to loads can be suppressed according to priority levels, considering not only the prediction value of the output voltage of the battery 101, but also the prediction value of the output current from the battery 101. Therefore, it is possible to stop or prevent the output voltage of the battery 101 from becoming too low, and to stop or prevent an excessive current from being further output in a state where the SOC is low. Thus, it is possible to realize such power suppression using a method with which power supply to loads with high priority levels is highly likely to be maintained.

The power control apparatus 10 is also provided with an air temperature detection unit 10B that detects the air temperature. The priority level setting unit 12 includes a storage unit 12A that stores correspondence information that defines a plurality of priority level setting methods and a plurality of temperature conditions associated with each other. The priority level setting unit 12 is configured to set the priority levels of power supply to the plurality of loads 110 based on the air temperature detected by the air temperature detection unit 10B and the correspondence information stored in the storage unit 12A, using the priority level setting method corresponding to the air temperature detected by the air temperature detection unit 10B. With this configuration, it is possible to change the priority level setting method according to the air temperature, and select a load for which power supply is to be suppressed or stopped, based on the priority levels that are suitable for the air temperature.

Other Embodiments

The present disclosure is not limited to the embodiment illustrated based on the above descriptions and the drawings, and the following embodiments are also included in the technical scope of the present disclosure. The above embodiment and the following embodiments may be variously combined as long as no contradiction arise.

Although the first embodiment shows an example in which one power supply path is connected to one load in FIG. 1, one power supply path may be connected to a plurality of loads.

Although the first embodiment shows an example in which the plurality of switch units are configured as semiconductor switches, any or all of the switch units may each be configured as a voltage conversion circuit that includes a semiconductor switch (for example, a DC-DC converter that steps up or steps down the voltage applied to the first conductive path 103, and applies the output voltage to the load).

In the arbitration processing in step S82, regarding the load that has been set such that the duty ratio therefor is reduced in FIG. 7, the duty ratio may be determined so as not to be higher than the duty ratio set through the processing in FIG. 7. For example, regarding the load for which the duty ratio is reset from 100% to 50% in the processing in FIG. 7, the duty ratio may be determined so as to be no greater than 50%.

In the first embodiment, when the prediction value of the output voltage of the battery is determined by the determination unit as being less than the threshold voltage value (the first threshold value) and the predetermined condition is satisfied (specifically, when the SOC of the battery is no less than the second threshold value), the duty ratios of the control signals to be output to the plurality of switch units are set based on the content of settings of the load state setting unit without performing load cut processing. However, the processing in steps S7 to S9 in FIG. 3 may be omitted. If this is the case, when the prediction value of the output voltage of the battery is determined by the determination unit as being no less than the threshold voltage value (the first threshold value), the duty ratios of the control signals to be output to the plurality of switch units are set based on the content of settings of the load state setting unit without performing load cut processing.

In the first embodiment, when the SOC of the battery is no less than the predetermined threshold SOC value and the predetermined condition is satisfied (specifically, when the prediction value of the battery voltage is no less than the first threshold value), the duty ratios of the control signals to be output to the plurality of switch units are set based on the content of settings of the load state setting unit without performing load cut processing. However, the processing in steps S3 to S6 in FIG. 3 may be omitted. If this is the case, when the SOC of the battery is no less than the predetermined threshold SOC value, the duty ratios of the control signals to be output to the plurality of switch units are set based on the content of settings of the load state setting unit without performing load cut processing.

In the first embodiment, load cut processing is performed at least when the prediction value of the battery is less than the first threshold value or when the SOC of the battery is less than the second threshold value. However, processing may be added such that load cut processing is also performed when another condition is satisfied (for example, when a deterioration level of the battery calculated using a well-known deterioration level calculation method is no less than a predetermined level). For example, load cut processing may be added such that the number of loads for which the duty ratio is reduced is increased as the deterioration level increases.

In the first embodiment, each of the operation units 141 to 145 is configured to switch instructions to the load corresponding thereto to three levels, namely a Hi instruction, a Lo instruction, and a stop instruction. However, any or all of the operation units 141 to 145 may be configured to switch instructions to the loads corresponding thereto between a Hi instruction (an instruction indicating a duty ratio of 100%) and a stop instruction (an instruction indicating a duty ratio of 0%). Alternatively, any or all of the operation units 141 to 145 may switch instructions to four or more levels.

The invention claimed is:

1. An on-board power control apparatus that is included in an on-board power control system including: a plurality of power supply paths for supplying power from a battery to a plurality of loads; and a plurality of switch units provided on the plurality of power supply paths, and that controls power supply from the battery to the plurality of loads, the on-board power control apparatus comprising:
a power control unit that is configured to output control signals such that an ON signal and an OFF signal are alternatingly output to each of the plurality of switch units, and controls a duty ratio of each of the control signals respectively supplied to the plurality of switch units; and
an air temperature detection unit that detects an air temperature,
wherein the power control unit includes:
a determination unit that determines whether or not a prediction value of an output voltage of the battery calculated using a predetermined voltage prediction value calculation method is less than a threshold voltage value, based on settings of a load state setting unit that sets operation states of the loads;
a duty ratio setting unit that sets duty ratios of control signals that are respectively output to the plurality of switch units;
a drive unit that outputs the control signals with the duty ratios set by the duty ratio setting unit, to the plurality of switch units; and
a priority level setting unit that sets priority levels of power supply to the plurality of loads,
the priority level setting unit includes a storage unit that stores correspondence information that defines a plurality of priority level setting methods and a plurality of temperature conditions associated with each other, and
the priority level setting unit sets priority levels of power supply to the plurality of loads based on the air temperature detected by the air temperature detection unit and the correspondence information stored in the storage unit, using a priority level setting method corresponding to the air temperature detected by the air temperature detection unit,
when the determination unit determines that the prediction value of the output voltage of the battery is no less than the threshold voltage value or when the determination unit determines that the prediction value is no less than the threshold voltage value and a predetermined condition is satisfied, the duty ratio setting unit sets the duty ratios of the control signals to be output to the plurality of switch units based on the content of settings of the load state setting unit, and
when the determination unit determines that the prediction value of the output voltage of the battery is less than the threshold voltage value, the duty ratio setting unit selects, from among the plurality of loads, a certain number of target loads for which power supply is to be stopped or suppressed, in ascending order of priority levels, based on the content of settings of the priority level setting unit, such that the prediction value of the output voltage calculated using the voltage prediction value calculation method satisfies a predetermined increase condition, and the duty ratio setting unit resets the duty ratios so as to reduce the duty ratios of the control signals to be output to the switch units provided on the power supply paths to the target loads thus selected.

2. The on-board power control apparatus according to claim 1,
wherein the power control unit includes an SOC detection unit that detects a value that can specify an SOC (State Of Charge) of the battery, and
when the prediction value of the output voltage of the battery is determined by the determination unit as being less than the threshold voltage value, and the SOC of the battery is less than a predetermined threshold SOC value, the duty ratio setting unit selects, from among the plurality of loads, a certain number of target loads, in ascending order of priority levels, based on the content of settings of the priority level setting unit, such that the prediction value of the output voltage calculated using the predetermined voltage prediction value calculation method satisfies the predetermined increase condition and a prediction value of an output current from the battery calculated using a predetermined current prediction value calculation method satisfies a predetermined reduction condition, and the duty ratio setting unit resets the duty ratios so as to reduce the duty ratios of the control signals to be output to the switch units provided on the power supply paths to the target loads thus selected.

3. An on-board power control apparatus that is included in an on-board power control system including: a plurality of power supply paths for supplying power from a battery to a plurality of loads; and a plurality of switch units provided on the plurality of power supply paths, and that controls power supply from the battery to the plurality of loads, the on-board power control apparatus comprising:

a power control unit that is configured to output control signals such that an ON signal and an OFF signal are alternatingly output to each of the plurality of switch units, and controls a duty ratio of each of the control signals respectively supplied to the plurality of switch units; and an air temperature detection unit that detects an air temperature, wherein the power control unit includes:

an SOC detection unit that acquires a value that can specify an SOC (State Of Charge) of the battery;

a priority level setting unit that sets priority levels of power supply to the plurality of loads;

a duty ratio setting unit that sets duty ratios of control signals that are respectively output to the plurality of switch units; and a drive unit that outputs the control signals with the duty ratios set by the duty ratio setting unit, to the plurality of switch units, and when the SOC of the battery is no less than a predetermined threshold SOC value or when the SOC of the battery is no less than the predetermined threshold SOC value and a predetermined condition is satisfied, the duty ratio setting unit sets the duty ratios of the control signals to be output to the plurality of switch units based on the content of settings of a load state setting unit that sets operation states of the loads, when the SOC of the battery is less than the threshold SOC value, the duty ratio setting unit selects a certain number of target loads for which power supply is to be stopped or suppressed, in ascending order of priority levels, based on the content of settings of the priority level setting unit, such that a prediction value of an output current from the battery calculated using a predetermined current prediction value calculation method satisfies a predetermined reduction condition, and the duty ratio setting unit resets the duty ratios so as to reduce the duty ratios of the control signals to be output to the switch units provided on the power supply paths to the target loads thus selected, the priority level setting unit includes a storage unit that stores correspondence information that defines a plurality of priority level setting methods and a plurality of temperature conditions associated with each other, and the priority level setting unit sets priority levels of power supply to the plurality of loads based on the air temperature detected by the air temperature detection unit and the correspondence information stored in the storage unit, using a priority level setting method corresponding to the air temperature detected by the air temperature detection unit.

4. An on-board power control system comprising:
the on-board power control apparatus according to claim 1; and
the plurality of switch units.

5. An on-board power control system comprising:
the on-board power control apparatus according to claim 2; and
the plurality of switch units.

6. An on-board power control system comprising:
the on-board power control apparatus according to claim 3; and
the plurality of switch units.

* * * * *